(12) United States Patent
Debnath et al.

(10) Patent No.: US 8,576,102 B2
(45) Date of Patent: Nov. 5, 2013

(54) CALIBRATION METHOD AND CIRCUIT

(75) Inventors: Chandrajit Debnath, Greater Noida (IN); Pratap Narayan Singh, Uttar Pradesh (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/310,932

(22) Filed: Dec. 5, 2011

(65) Prior Publication Data

US 2013/0141263 A1   Jun. 6, 2013

(51) Int. Cl.
    *H03M 1/10*   (2006.01)
(52) U.S. Cl.
    USPC ........... 341/120; 341/155; 341/117; 341/118; 341/119
(58) Field of Classification Search
    USPC .......................................... 341/117–120, 155
    See application file for complete search history.

(56) References Cited

U.S. PATENT DOCUMENTS

2006/0284750 A1* 12/2006 Keskin .......................... 341/120
2011/0102217 A1*  5/2011 Hsu ............................... 341/120

OTHER PUBLICATIONS

Lee, Hae-Seung et al: "Circuits and Systems Letters, Self-Calibration Technique for A/D Converters," 1983 IEEE, pp. 188-190.

* cited by examiner

*Primary Examiner* — Jean B Jeanglaude
(74) *Attorney, Agent, or Firm* — Gardere Wynne Sewell LLP

(57) ABSTRACT

An analog input signal is sampled, and the sampled analog input signal is converted to a digital value. A calibration value is also sampled, and a single bit of an N bit offset value is calculated from the sampled calibration value. The sampling operations are alternatively performed so that one bit of the offset value is generated for each generated digital value. For example, the process is repeated N times to calculate all N bits of the offset value while generating N digital values.

21 Claims, 5 Drawing Sheets

Figure 4

| Calibration Cycle | Conversion Cycle | Data Sampled | Comparison Offset Voltage Sampled | Offset Voltage Generated | Offset Used | Data Output |
|---|---|---|---|---|---|---|
| $Cal_1$ | $Con_1$ | $S_1$ | $A_1$ | - | None | $S_1$ |
|  | $Con_2$ | $S_2$ | $A_2$ | - | None | $S_2$ |
|  | $Con_3$ | $S_3$ | $A_3$ | - | None | $S_3$ |
|  | ... | ... | ... | ... | ... | ... |
|  | $Con_N$ | $S_N$ | $A_N$ | $V_{off1} = \sum A_1 : A_N$ | None | $S_N$ |
| $Cal_2$ | $Con_{N+1}$ | $S_{N+1}$ | $B_1$ | - | $V_{off1}$ | $S_{N+1} - V_{off1}$ |
|  | $Con_{N+2}$ | $S_{N+2}$ | $B_2$ | - | $V_{off1}$ | $S_{N+2} - V_{off1}$ |
|  | $Con_{N+3}$ | $S_{N+3}$ | $B_3$ | - | $V_{off1}$ | $S_{N+3} - V_{off1}$ |
|  | ... | ... | ... | ... | ... | ... |
|  | $Con_{2N}$ | $S_{2N}$ | $B_N$ | $V_{off2} = \sum B_1 : B_N$ | $V_{off1}$ | $S_{2N} - V_{off1}$ |
| $Cal_3$ | $Con_{2N+1}$ | $S_{2N+1}$ | $C_1$ | - | $V_{off2}$ | $S_{2N+1} - V_{off2}$ |
|  | $Con_{2N+2}$ | $S_{2N+2}$ | $C_2$ | - | $V_{off2}$ | $S_{2N+2} - V_{off2}$ |
|  | $Con_{2N+3}$ | $S_{2N+3}$ | $C_3$ | - | $V_{off2}$ | $S_{2N+3} - V_{off2}$ |
|  | ... | ... | ... | ... | ... | ... |
|  | $Con_{3N}$ | $S_{3N}$ | $C_N$ | $V_{off3} = \sum C_1 : C_N$ | $V_{off2}$ | $S_{3N} - V_{off2}$ |
| $Cal_4$ | $Con_{3N+1}$ | $S_{3N+1}$ | $D_1$ | - | $V_{off3}$ | $S_{3N+1} - V_{off3}$ |
|  | $Con_{3N+2}$ | $S_{3N+2}$ | $D_2$ | - | $V_{off3}$ | $S_{3N+2} - V_{off3}$ |
|  | $Con_{3N+3}$ | $S_{3N+3}$ | $D_3$ | - | $V_{off3}$ | $S_{3N+3} - V_{off3}$ |
|  | ... | ... | ... | ... | ... | ... |
|  | $Con_{4N}$ | $S_{4N}$ | $D_N$ | $V_{off4} = \sum D_1 : D_N$ | $V_{off3}$ | $S_{4N} - V_{off3}$ |

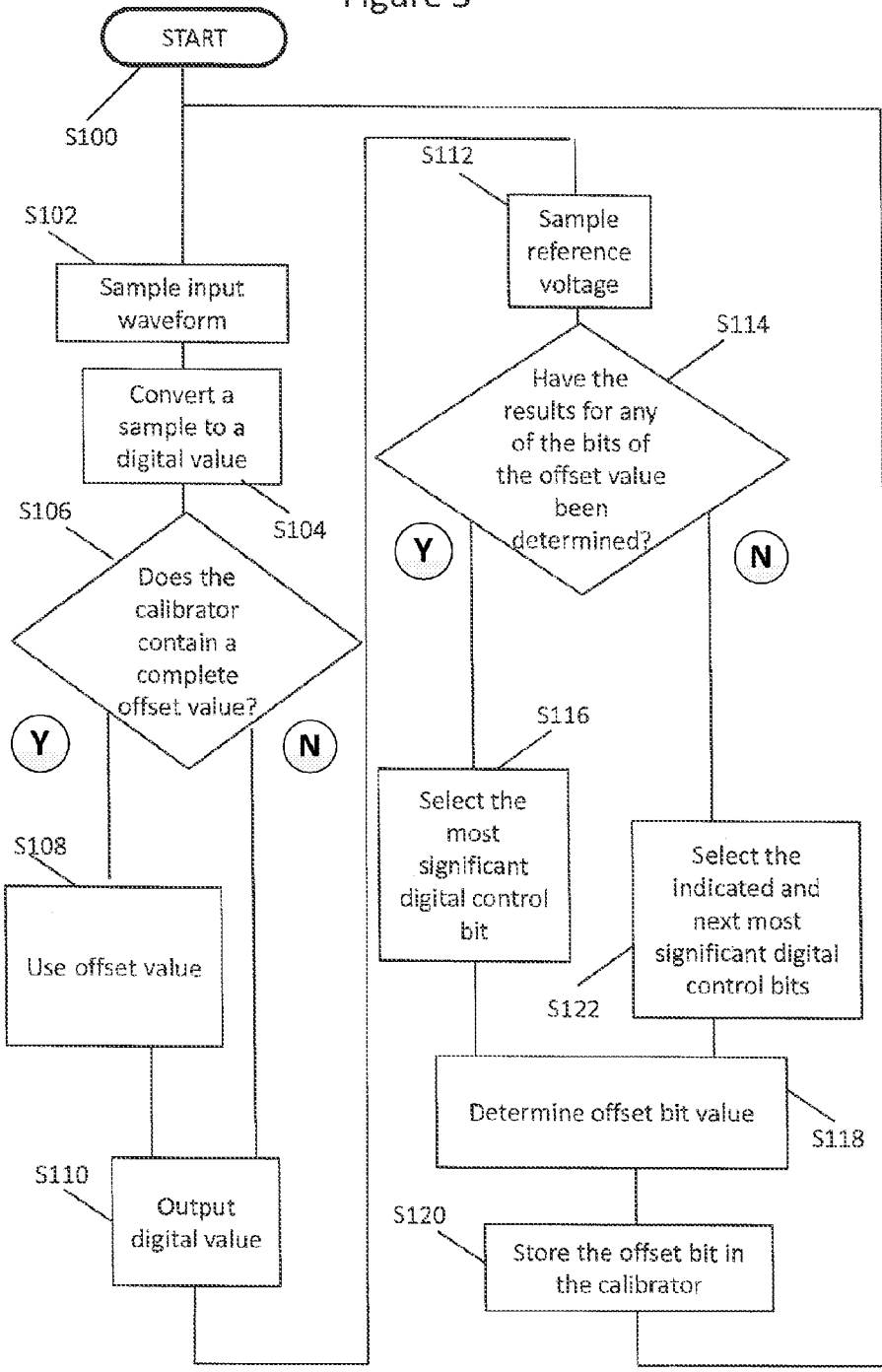

CALIBRATION METHOD AND CIRCUIT

TECHNICAL FIELD

The present invention relates to a calibration method and circuit and in particular but not exclusively for successive approximation register analog-to-digital converters (SA-RADCs).

BACKGROUND

A SARADC may convert analog input signals to digital output signals by comparing a sample of the input signal with a range of discrete output levels of an internal digital-to-analog converter until the closest approximation to the sample has been found.

SUMMARY

In an embodiment, a method comprises: (a) sampling an analog input signal; (b) converting the sampled analog input signal to a digital value; (c) sampling a calibration value; (d) calculating from the sampled calibration value at least one bit, but less than N bits, of an N bit offset value; (e) repeating steps (a)-(d) a number of times so as to calculate all N bits of the offset value.

In an embodiment, a converter comprises: a sample/hold circuit having a first input configured to receive an analog input signal and a second input configured to receive a calibration signal; a comparator configured to compare a sample of the analog input signal from the sample/hold circuit to a reference; a successive approximation register configured to receive an output of the comparator and generate a digital value; and a calibration circuit configured to process a sample of the calibration signal from the sample/hold circuit to generate an offset value applied by the successive approximation register in generating the digital value; wherein a single bit of an N bit offset value is determined for each sample of the analog input signal by the sample/hold circuit and comparison by the comparator.

In an embodiment, a method comprises: alternatively: sampling an analog input signal; and sampling a calibration signal; and processing the analog input signal samples to generate digital output signals; processing calibration signal samples to generate an N bit offset value; and applying the N bit offset value when generating the digital output signals; wherein a single bit of the N bit offset value is determined for each alternatively sampling operation.

In an embodiment, a method comprises: (a) sampling an analog input signal; (b) converting the sampled analog input signal to a digital value; (c) sampling a calibration value; (d) calculating from the sampled calibration value at least one bit, but less than N bits, of an N bit offset value; (e) repeating steps (a)-(d) a number of times so as to calculate all N bits of the offset value.

In an embodiment, a converter comprises: a sample/hold circuit having a first input configured to receive an analog input signal and a second input configured to receive a calibration signal; a comparator configured to compare a sample of the analog input signal from the sample/hold circuit to a reference; a successive approximation register configured to receive an output of the comparator and generate a digital value; and a calibration circuit configured to process a sample of the calibration signal from the sample/hold circuit to generate an offset value applied by the successive approximation register in generating the digital value; wherein at least one bit, but less than N bits, of an N bit offset value is determined for each sample of the analog input signal by the sample/hold circuit and comparison by the comparator.

There is provided according to a first aspect a method comprising: alternatively sampling: x input samples of a first set of n input samples, where $1 \leq x < n$; and y reference samples of a set of m reference samples of a reference signal where $1 \leq y < m$.

The method may further comprise determining a first reference value from said m reference samples.

The method may further comprise applying said first reference value to a second set of input samples.

The method may further comprise alternatively sampling x inputs of said second set of n input samples; and resampling said y reference samples of a set of m reference samples.

The method may further comprise determining a second reference value from said re-sampled reference samples; and updating said first reference value with said second reference value. Here, m may equal n, and x and y may be equal to 1.

The method may further comprise determining a sampling ratio, said sampling ratio comprising the ratio of x to y; said ratio depending on at least one of: sampling accuracy; and operating speed.

The method may further comprise converting said input samples from an analog value to a digital value. Here, y may be equal to the number of bits of said digital value.

The determining a first reference value may comprise combining said y reference samples.

There is provided according to a second aspect a method of analog-to-digital conversion comprising: alternatively sampling: x input samples of a first set of n input samples, where $1 \leq x < n$; and y reference samples of a set of m reference samples of a reference signal where $1 \leq y < m$ using at least one bit of the analog-to-digital converter; comparing each of said sampled reference sample to an expected reference value; and storing a result of said comparison.

There is provided according to a third aspect an apparatus comprising: a sample/hold register configured to alternate between sampling: x input samples of a first set of n input samples, where $1 \leq x < n$; and y reference samples of a set of m reference samples of a reference signal where $1 \leq y < m$.

The apparatus may further comprise a calibrator configured to determine a first reference value from said m reference samples.

The calibrator may be configured to apply said first reference value to a second set of input samples.

The sample/hold register may be further configured to alternatively: sample x inputs of said second set of n input samples; and resample said y reference samples of a set of m reference samples.

The calibrator may be configured to: determine a second reference value from said re-sampled reference samples; and update said first reference value with said second reference value. Here, m may equal n.

The calibrator may be configured to determine said first reference value by combining said y reference samples.

The apparatus may further comprise a converter configured to convert said input samples from an analog value to a digital value. y may equal to the number of bits of said digital value. Here, x and y may be equal to 1.

There is provided according to a forth aspect an analog-to-digital converter comprising: a sample/hold register configured to alternate between sampling: x input samples of a first set of n input samples, where $1 \leq x < n$; and y reference samples of a set of m reference samples of a reference signal where $1 \leq y < m$; a comparator configured to compare each of said sampled reference samples to an expected reference value; a calibrator configured to: store a result of said comparison and apply said results to a second set of input samples.

There is provided according to a fifth aspect an apparatus comprising: sample/hold means for alternating between sampling x input samples of a first set of n input samples, where 1≤x<n; and y reference samples of a set of m reference samples of a reference signal where 1≤y<m.

BRIEF DESCRIPTION OF THE DRAWINGS

Embodiments of the invention will now be described, by way of example only, with reference to the Figures, in which:

FIG. 4 shows a table of data for the converter of FIG. 2; and FIG. 5 shows a method of an embodiment.

DETAILED DESCRIPTION OF THE DRAWINGS

Figure 1:
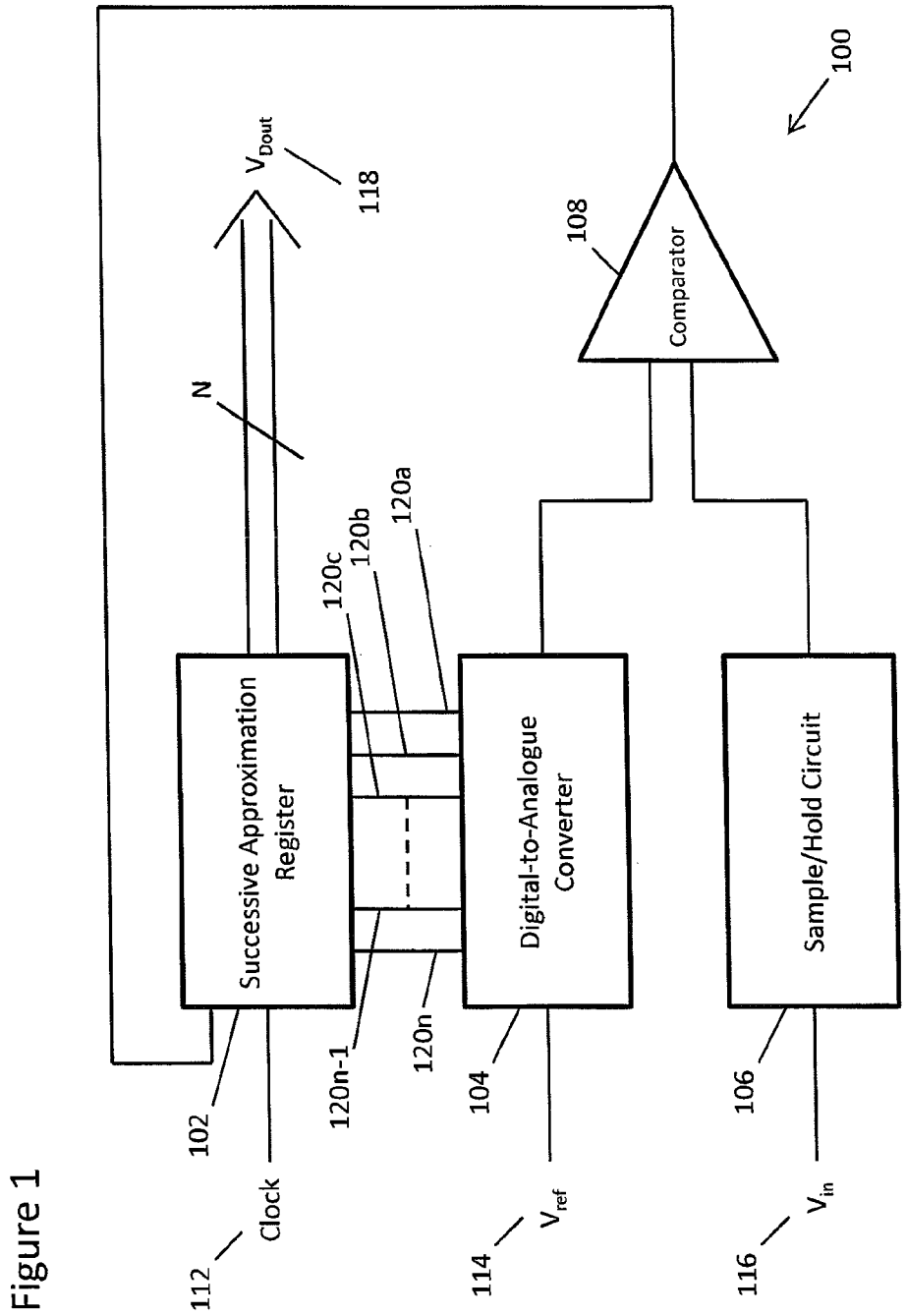
FIG. 1 shows a successive approximation register analog-to-digital converter.

FIG. 1 shows a successive approximation register analog-to-digital converter 100. An analog input signal 116 which is to be converted to an N-bit digital output signal 118 is provided to a sample/hold circuit 106. The sample/hold circuit 106 provides an output which is received as an input at a comparator 108. A reference signal 114 is provided as an input to a digital-to-analog converter 104. The digital-to-analog converter (DAC) 104 also receives as an input at least one digital control bit 120a, 120b, 120c, 120n-1, 120n. The digital-to-analog converter 104 provides an output which is received as a second input at the comparator 108. In some embodiments the signals may be voltage signals or current signals.

The signal received from the sample/hold circuit 106 is compared to the signal received from the DAC 104 by the comparator 108. The comparator 108 provides an output which is received as an input at a successive approximation register (SAR) 102. The successive approximation register 102 also receives a clock signal 112 as an input and provides the N-bit digital output signal 118. The successive approximation register also provides the at least one comparison digital control bit 120a, 120b, 120c, 120n-1, 120n which are received at the input of the DAC 104.

The SARADC 100 may digitize analog signals by successively comparing the input analog signal to a set of discrete comparison voltages provided by the DAC 104 and recording whether the output of the comparator indicates that the input value is above or below each discrete voltage. The result may be recorded. In some embodiments, the difference between the discrete comparison voltage and the sample of the input analog signal may be recorded. The output signal value may then be generated from the results of the comparison. In some embodiments, the output signal may be encoded as an N-bit binary number, code or word. In some embodiments the output signal may be one of a discrete set of voltages.

In some embodiments, the first discrete comparison voltage may be half of the reference voltage value 114, the second discrete comparison voltage may be a quarter of the reference voltage 114 and the third discrete comparison voltage may be an eighth of the reference voltage 114. In these embodiments the nth discrete comparison voltage may be expressed as:

$$V_{Cn} = \frac{V_{Ref}}{2^n} \quad (1)$$

where: $V_{Cn}$ is the nth comparison voltage and $V_{Ref}$ is the reference voltage. Other quantization intervals may be used and embodiments are not limited to those defined by equation 1. In some embodiments, the quantization intervals may be linear or nonlinear.

During an analog-to digital conversion cycle, the input signal 116 may be sampled by the sample/hold register. The SAR indicates to the DAC that the sampled voltage may then be compared to the first comparison voltage by flagging the first digital control bit 120a during a first comparison cycle. When the comparator 108 indicates that the input voltage 116 is greater than the first comparison voltage, the SAR indicates to the DAC that the input voltage may then be compared to a sum of the first comparison voltage and the second comparison voltage during a second comparison cycle by flagging the first digital control bit 120a and the second control bit 120b. When the comparator 108 indicates that the input voltage is less than the first comparison voltage, the SAR indicates to the DAC that the input voltage 116 may then be compared only to the second comparison voltage during the second comparison cycle by only flagging the second digital control bit 120b. During each successive comparison cycle, the SAR indicates to the DAC that the next comparison voltage is added to the result of previous comparison by flagging the corresponding digital control bits until all of the comparison voltages have been tested. The digital sample value of the input signal is equal to the sum of the comparison voltages which when compared to the input sample produce a "greater than" result. In other words, the digital approximation of the sample is reached by means of an interval bisection iterative method. Thus, the number of comparison cycles required in order to reach the digital approximation of the sample will depend on the number of comparison voltages available.

The digital conversion may indicate the value of the sampled input signal 116 using an n-bit binary number where each bit of the binary number indicates the result of each of the n comparisons. For example, in an embodiment using an 8-bit converter, when the comparison indicate that the closest approximation to the value of the input signal 116 may be reached using the sum of the first, fourth, fifth and seventh comparison voltages, the value of the binary number output by the SARADC may be 10011010 where the most significant bit indicates whether the first comparison voltage is to be used and the least significant bit indicates whether the last comparison voltage is to be used.

In some embodiments, there may be a voltage offset generated by the SARADC. This offset may be due to the physical characteristics of an individual SARADC circuit. The offset may also vary over time due to changes in the operating voltages of the SARADC and ambient temperatures. These causes of offset voltage may be collectively referred to as PVT variations. The main contribution to the offset voltage may be from the comparator 108. The overall voltage offset of the SARADC may need to be less than the value of the smallest comparison voltage. Thus, there may be a need to calibrate or compensate for the offset voltage in order to improve the performance and accuracy of the SARADC.

The SARADC 100 shown in FIG. 1 may use auto zeroing to compensate for the comparator offset voltage by storing a value of the voltage offset within the comparator prior to the start of the analog-to-digital conversion process. This stored value is then used during the compensation of the output signal. This method may result in an output signal which may be calibrated such that it is independent of PVT variations. However, auto zeroing may have high power and current consumption requirements. Furthermore, over time the PVT characteristics may change resulting in inaccurate calibration.

A PVT calibration method may calibrate the voltage offset of the comparator by adjusting the output signal using a stored offset value. This offset value may be determined based on the individual physical characteristics of each ADC, a current operating voltage of the ADC and the ambient temperature. This method has low power consumption requirements. However, the offset value may need to be reset each time the operating voltage or ambient temperature changes.

It is known to calculate a calibration or offset value which takes N cycles for an N bit calibration value. This calibration value is then applied to the next input voltage which is input for conversion to a digital value. As described above, the conversion of an input voltage to a digital output value takes N cycles. An example of this is shown in the first line 301 of FIG. 3. A sampling phase 310 is provided for the input voltage. In this example, the sampling phase 310 lasts for three clock cycles. The frequency of the clock cycles may be determined by the input clock signal 112. Once the sampling phase is complete, the conversion phase 312 begins. For an 8-bit converter, eight clock cycles are required for the conversion of an input signal sample to a digital output. A single offset sampling cycle 314 may then be required. An offset value is then determined in a calibration phase which takes 8 cycles. Thus, in this example, each conversion cycle may comprise twenty clock cycles.

In embodiments, the N cycles for determining a calibration value are interleaved with cycles for converting input samples to digital output samples. For example, a first input voltage is converted to a digital value (taking N cycles). The first bit of the calibration value is determined. This is followed by the conversion of a second input voltage to a digital value. The second bit of the calibration value is determined. This followed by the conversion of a third input voltage to a digital value. This continues until all the bits of the calibration value have been calculated. This process is repeated.

Figure 3:
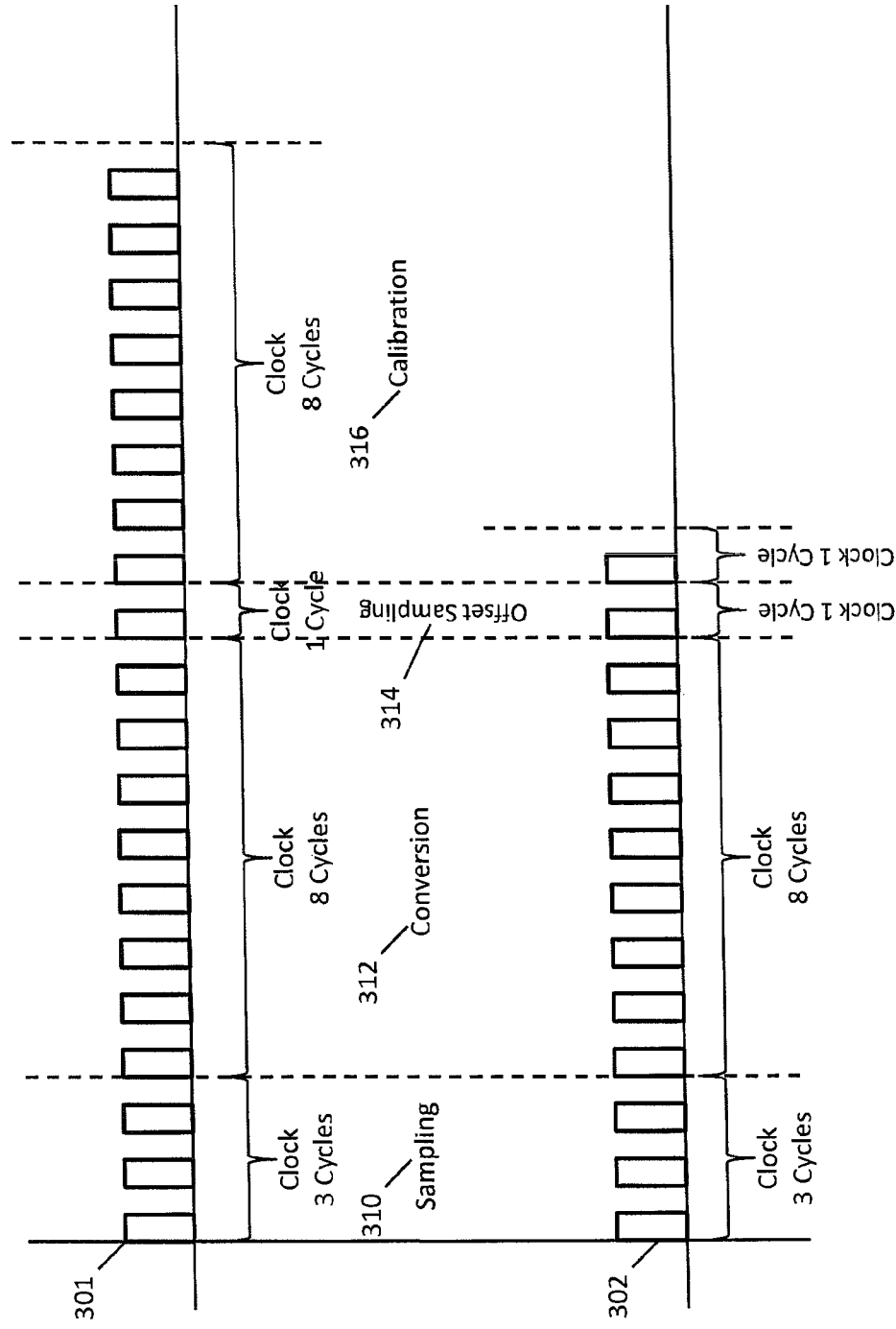
FIG. 3 shows a timing diagram for an N-cycle successive approximation register analog-to-digital converter and a timing diagram for a 1-cycle successive approximation register analog-to-digital converter.

This is illustrated in the second line 302 of FIG. 3. For one 8-cycle device, the sampling phase 310 for the input voltage requires three clock cycles, the 8-bit conversion cycle 312 requires eight clock cycles and the offset sample phase 314 may require one clock cycle. This is followed by a single cycle for determining one bit of the offset value. The cycle of the line 302 of FIG. 3 is repeated eight times to calculate an entire offset value. Each cycle of line 302 requires 13 clock cycles.

Figure 2:
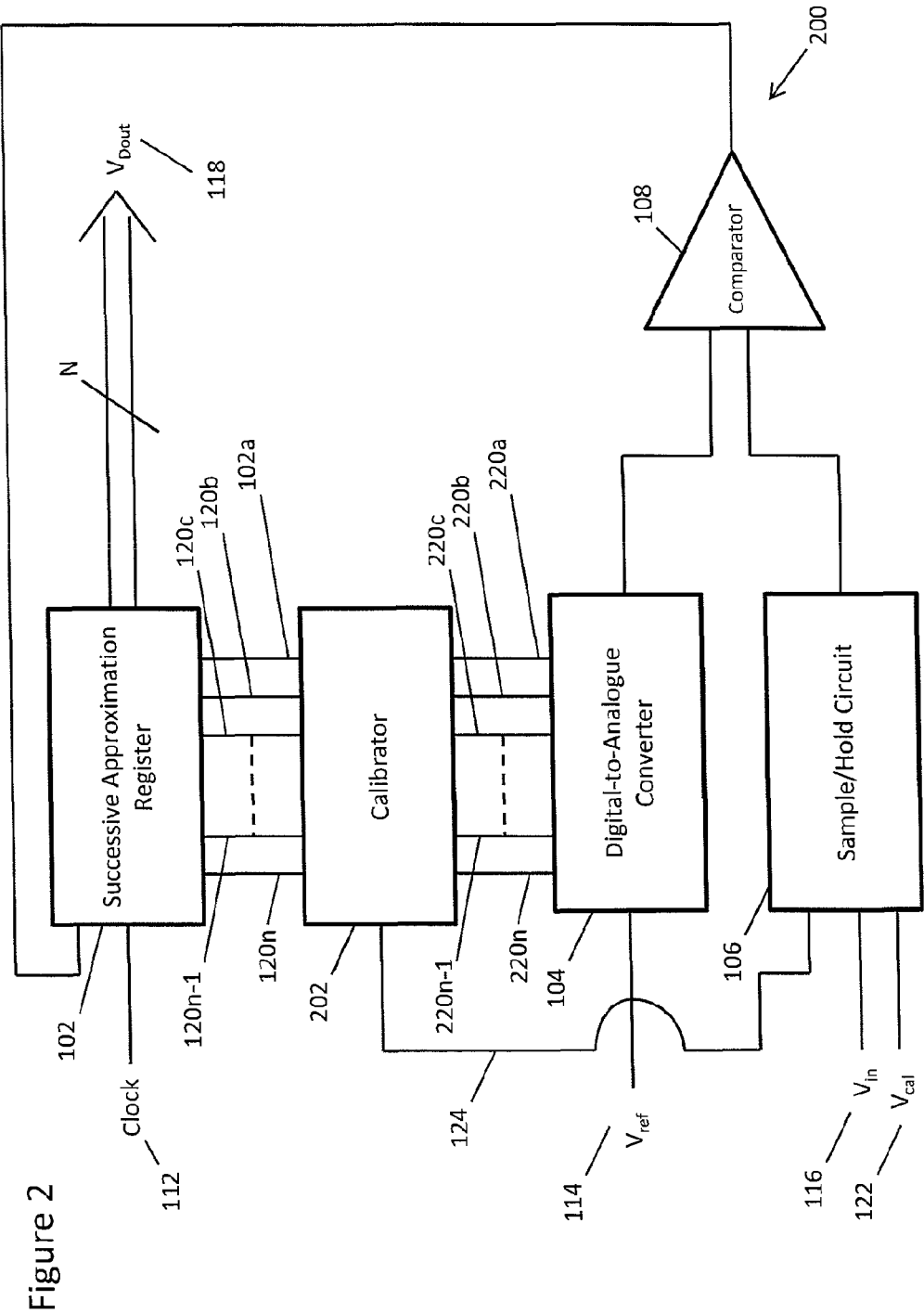
FIG. 2 shows an embodiment of a calibrated successive approximation analog-to-digital converter.

Reference is made to FIG. 2. FIG. 2 shows an embodiment of a calibrated successive approximation register analog-to-digital converter (CSARADC) 200. Those parts which are referenced by the same reference number operate in generally in the same way as described in relation to FIG. 1 unless otherwise stated. In general the arrangement of FIG. 2 is similar to the arrangement of FIG. 1 with the addition of a calibrator 202. The outputs of the successive approximation register 120a-120n are input to the calibrator 202. If calibration (offset) bits are available, the calibration bits are applied to the input bit values received from the successive approximation register 102 to provide calibrated values 220a-n. The digital-to-analog converter (DAC) 104 receives the calibrated bit values 220a-n output by the calibrator 202.

A calibration control signal 124 is applied to the calibrator 202 and the sample and hold circuit. This will control if the CSARADC is in a calibration mode or not. A calibration voltage Vcal 122 is input to the sample and hold circuit and is used when the CSARADC is in the calibration mode. Alternatively the reference voltage Vref may be used as the calibration voltage Vcal.

During calibration the sample/hold register 106 switches from sampling the input signal to sampling the calibration voltage Vcal. Vcal is sampled and converted using one of the comparison voltages 120a ... 120n. The converted value is compared to an expected result of the conversion output. The difference between the converted value and the expected result may indicate the offset voltage associated with the comparison voltage which is being monitored. The result may be stored in the calibrator 202. The calibration signal may then switch to indicate that a new input value may be sampled.

The second input value may then be sampled after which the calibration signal may switch to indicate the calibration phase and an offset value for a different one of the bits 120a ... 120n of the DAC 104 may be determined using the method described above. This value may also be stored in the calibrator 202. Once an offset value has been determined for each of the comparison voltages 120a ... 120n, the set of stored offset values may be summed to provide an overall offset voltage. This offset voltage may be subtracted from subsequent output sample voltages 118 until an updated offset voltage has been calculated.

Reference is made to FIG. 5 which shows a method which is carried out by the CSARADC of FIG. 2. In this example N is equal to 8. This is by way of example only and N can have any other suitable value.

The method starts at step s100.

The analog input waveform (Vin) is sampled in step S102. This is the first voltage to be converted.

The sample (Vin) is then converted into a digital value Vout in step S104. The conversion of the input sample Vin into Vout will require 8 clock cycles. This is as described in relation to FIG. 1.

In step S106, a check is made as to whether there is an offset (calibration) value stored in the calibrator which is to be applied to the digital value. During the conversion of the first sample, there will be no offset value as no offset value has yet been determined.

As there is no offset value the next step is S110 in which the digital value is output without modification by the calibrator 202.

The next steps will calculate a first bit of a calibration value. In step S112 the calibration voltage Vcal is sampled. This is a known reference voltage. In step S114, it is determined if any bits of the offset value have been determined. In this case as no other bits of the offset value have been determined, the next step is step S116.

In step S116, the most significant bit is selected. This is the bit of the offset value which is to be determined during the first waveform conversion cycle.

In step S118, a comparison is made based on the value of a bit determined from the calibration voltage and an expected value of that bit.

In step S120, based on the comparison a respective bit of the offset is determined and stored in the calibrator.

The method returns to the step S102 to sample the next input waveform, i.e. the next input voltage Vin and the following steps are performed—S104, S106, and S110.

This is followed by steps S112 and S114. In step S114, it is determined that that one of the bits of the offset value been previously determined. Accordingly the next step is step S122 in which the next most significant bit of the offset value is selected for evaluation. This is followed by steps S118 and S120 as previously described.

The method returns to step S102 to sample the next input waveform, i.e. the next input voltage Vin and the following steps are performed—S104, S106, and S110.

This in turn is followed by steps S112, S114, S118 and S120. This is repeated until all eight bits of the offset value have been evaluated. This means that 8 input voltages have been processed and eight cycles have been performed to determine the offset value.

After the first offset value has been performed, for the ninth input voltage, steps 102, 104 and 106 are performed. However in step S106, it is determined that there is an offset value stored in the calibrator. The next step is then step S108 where the offset value is applied so that the output voltage Vout is compensated for the comparator offset or the like. The next step is then S110 as described previously.

The steps to calculate a bit of a new offset value are carried out. One bit is determined for each input sample which is converted. Until the new offset value is completely calculated, the current offset value is used in the conversion of the input analog voltage to the digital output voltage.

Reference is made to FIG. 4 which has a table which comprises four calibration cycles 402 (Cal1, Cal2, Cal3 and Cal4). A calibration cycle will provide a full offset or calibration value. Each calibration cycle 402 has duration of N conversion cycles 404. Calibration cycle Cal1 comprises conversion cycles Con1, Con2, Con3 ... ConN. Calibration cycle Cal2 comprises conversion cycles ConN+1, ConN+2, ConN+3 ... Con2N. Calibration cycle Cal3 comprises conversion cycles Con2N+1, Con2N+2, Con2N+3 ... Con3N. Calibration cycle Cal4 comprises conversion cycles Con3N+1, Con3N+2, Con3N+3 ... Con4N.

During each conversion cycle 404, one input voltage sample 116 (see column 406) is converted from an analog value to a digital value (see column 414) and one comparison voltage (see column 408) is also sampled to provide one bit of the offset value (see column 410). During conversion cycle Con1, the first sample S1 is converted and the offset of the first comparison voltage is sampled and stored as offset voltage A1. During conversion cycle Con2 the second sample S2 is converted and the offset of the second comparison voltage is sampled and stored as offset voltage A2. This continues to the nth conversion cycle ConN. Thus at the end of the calibration cycle Cal1, the first N samples have been converted from analog to digital form and the offset of all N comparison voltages have been sampled and stored as offset values A1, A2, A3 ... AN. The N offset comparison voltage values A1 ... AN are combined to generate an N-bit comparison voltage offset Voff1 wherein each offset value A1, A2, A3 ... AN forms a bit of the total voltage offset binary word. This value may represent the total comparison voltage offset which is present within the SARADC during the first calibration cycle. The total voltage offset Voff1 may be applied to future samples which are converted by the SARADC. No offset is used in the conversion of the input voltages to digital outputs in the first cycle.

The same process may be applied during the subsequent calibration cycles. In each calibration cycle, the offset determined in the previous cycle is used.

In some embodiments, the calibrator 202 may be located within the successive approximation register 102. In some embodiments the calibrator 202 may be located at the output of the successive approximation register 102.

In some embodiments the conversion cycle may comprise other phases to those shown in FIG. 3.

In some embodiments, the number of clock cycles required for each phase of the calibration cycle may be longer or shorter than those shown in FIG. 3. Thus the sampling phase may comprise more or less than three clock cycles.

The length of the conversion phase may be dependent on the number of bits in the DAC part of the SARADC. In the example shown N is 8 but N may have any other suitable value.

The sampling and calibration phases may be longer than one cycle. The offset sampling 314 and the calibration 316 phases may occur before the sampling 310 or conversion 312 phases in each conversion cycle.

In some embodiments the SAR and the calibrator may be configured to control how many bits of the calibration voltage are sampled or updated in any one conversion phase. In some embodiments this may be programmed or hardwired into the SAR and calibrator.

In the example shown, one input sample is converted to a digital value followed by one bit of the offset value. In one alternative y bits of the offset value may be calculated per input sample where y is less than M (the number of bits of the offset value). In some embodiments, x input samples may be sequentially converted followed by y bits of the offset value being calculated. x and y may be the same or different. The values of x are $1 \leq x < N$ and the values of y are $1 \leq y < M$.

In some embodiment, the method may start with a determination of the offset value which is then used for the next N input samples. In the meantime, the new offset value will be calculated.

In some embodiments, the calibrator 202 and the successive approximation register 102 may be configured to control the operation of the SARADC in order to achieve the required ratio of sampling of input data to calibration of comparison voltages There may be a need for a fast, low power voltage offset calibration method which may be independent of the physical characteristics of the circuitry and the operating voltages and temperatures.

Some embodiments may provide a calibration method which is independent of the operating voltage and temperature of the ADC, as well as the physical characteristics of the circuitry. The calibration method may have low power consumption requirements and cause minimal reduction in the conversion rate of the ADC. The calibration may occur in the background of the operation of the ADC. The calibration may occur continuously during the operation of the ADC and improve the accuracy of the output voltages.

In some embodiments, the iteration method used in the ADC may be an iteration method other than interval bisection. For example, Newton-Raphson or fixed-point iteration may be used.

In some embodiments, the reference voltage Vref received at the sample/hold circuit may be approximately equal to the calibration voltage Vcal received at the DAC.

In some embodiments, the calibration voltage Vcal received at the sample/hold circuit may be different to the reference voltage Vref received at the DAC.

In some embodiments, the offset voltage may be applied to the samples in the digital domain. This may occur by applying the offset voltage word 410 to the digital outputs 406. In some embodiments the offset voltage may be applied to the samples in the analog domain. This may occur by converting the digital value of 410 into an analog value and then applying it to the analog input samples 405 in the sample/hold circuit 106.

In some embodiments, two or more successive generated offset code words may be combined in order to apply an averaged offset voltage to the digital samples. In some embodiments this average may be a moving point or a fixed point average. For example, in some embodiments one or more previous offset voltages may be retained and combined with the current In some embodiments, each bit of the applied offset voltage may be updated as soon as one or more new offset bit values have been determined. For example at the end of Conversion Cycle Con$_{N+}$1 the digital bit evaluated corresponding to the sampled offset voltage $B_1$ may replace $A_1$ such that the offset voltage applied to sample $S_{n+2}$ in conversion cycle Con$_{n+2}$ is formed of the bits: $B_1A_2A_3 \ldots A_N$.

Various modifications to the embodiments described above will readily occur to the skilled person. The invention is not limited to theses specific examples.

What is claimed is:

1. A method, comprising:
   (a) sampling an analog input signal;
   (b) converting the sampled analog input signal to a digital value;
   (c) sampling a calibration value;
   (d) calculating from the sampled calibration value a single bit of an N bit offset value;
   (e) repeating steps (a)-(d) N times so as to calculate all N bits of the offset value.

2. The method of claim 1, wherein converting the sampled analog input signal to a digital value further comprises applying a current N bit offset value in generating the digital value.

3. The method of claim 2, further comprising updating the N bit offset value following completion of step (e) and the calculation of all N bits of the offset value.

4. The method of claim 1, wherein the repeating of step (d) N times, in accordance with step (e), calculates the single bits of the N bit offset value in an order starting with a most significant bit of the N bit offset value and ending with a least significant bit of the N bit offset value.

5. The method of claim 1, wherein converting the sampled analog input signal to a digital value further comprises:
   determining whether a current N bit offset value is available; and
   if so, applying a current N bit offset value in generating the digital value.

6. The method of claim 5, further comprising: if the current N bit offset value is not available, then generating the digital value without offset correction.

7. The method of claim 1, wherein calculating from the sampled calibration value the single bit of the N bit offset value comprises:
   comparing said sampled calibration value to an expected value; and
   using a result of said comparison to calculate the offset value bit.

8. A method, comprising:
   (a) sampling an analog input signal;
   (b) converting the sampled analog input signal to a digital value;
   (c) sampling a calibration value;
   (d) calculating from the sampled calibration value at least one bit, but less than N bits, of an N bit offset value;
   (e) repeating steps (a)-(d) a number of times so as to calculate all N bits of the offset value.

9. The method of claim 8, wherein converting the sampled analog input signal to a digital value further comprises applying a current N bit offset value in generating the digital value.

10. The method of claim 9, further comprising updating the N bit offset value following completion of step (e) and the calculation of all N bits of the offset value.

11. The method of claim 8, wherein the repeating of step (d) the number of times, in accordance with step (e), calculates the at least one bits of the N bit offset value in an order starting with more significant bits of the N bit offset value and ending with less significant bits of the N bit offset value.

12. The method of claim 8, wherein converting the sampled analog input signal to a digital value further comprises:
   determining whether a current N bit offset value is available; and
   if so, applying a current N bit offset value in generating the digital value.

13. The method of claim 12, further comprising: if the current N bit offset value is not available, then generating the digital value without offset correction.

14. The method of claim 8, wherein calculating from the sampled calibration value the at least one bit of the N bit offset value comprises:
   comparing said sampled calibration value to an expected reference value; and
   using a result of said comparison to calculate the at least one offset value bit.

15. A converter, comprising:
   a sample/hold circuit having a first input configured to receive an analog input signal and a second input configured to receive a calibration signal;
   a comparator configured to compare a sample of the analog input signal from the sample/hold circuit to a reference;
   a successive approximation register configured to receive an output of the comparator and generate a digital value; and
   a calibration circuit configured to process a sample of the calibration signal from the sample/hold circuit to generate an offset value applied by the successive approximation register in generating the digital value;
   wherein a single bit of an N bit offset value is determined for each sample of the analog input signal by the sample/hold circuit and comparison by the comparator.

16. The converter of claim 15, further wherein the calibration circuit is configured to update the N bit offset value following determination of N new bits of the offset value.

17. The converter of claim 15, wherein the sample/hold circuit is configured to alternately sample the analog input signal and sample the calibration signal, with the calibration circuit determining the single bit of the N bit offset value for each alternate sampling.

18. A converter, comprising:
   a sample/hold circuit having a first input configured to receive an analog input signal and a second input configured to receive a calibration signal;
   a comparator configured to compare a sample of the analog input signal from the sample/hold circuit to a reference;
   a successive approximation register configured to receive an output of the comparator and generate a digital value; and
   a calibration circuit configured to process a sample of the calibration signal from the sample/hold circuit to generate an offset value applied by the successive approximation register in generating the digital value;
   wherein at least one bit, but less than N bits, of an N bit offset value is determined for each sample of the analog input signal by the sample/hold circuit and comparison by the comparator.

19. The converter of claim 18, further wherein the calibration circuit is configured to update the N bit offset value following determination of N new bits of the offset value.

20. The converter of claim 18, wherein the sample/hold circuit is configured to alternately sample the analog input signal and sample the calibration signal, with the calibration circuit determining the at least one bit, but less than N bits of the N bit offset value for each alternate sampling.

21. A method, comprising:
alternatively:
    sampling an analog input signal; and
    sampling a calibration signal;
processing the analog input signal samples to generate digital output signals;
processing calibration signal samples to generate an N bit offset value; and
applying the N bit offset value when generating the digital output signals;
wherein a single bit of the N bit offset value is determined for each alternative sampling operation.

* * * * *